United States Patent [19]

Rosvold

[11] 3,925,880

[45] Dec. 16, 1975

[54] SEMICONDUCTOR ASSEMBLY WITH BEAM LEAD CONSTRUCTION AND METHOD

[75] Inventor: Warren C. Rosvold, Sunnyvale, Calif.

[73] Assignee: Signetics Corporation, Sunnyvale, Calif.

[22] Filed: June 18, 1973

[21] Appl. No.: 371,054

Related U.S. Application Data

[63] Continuation of Ser. No. 138,497, April 29, 1971, abandoned.

[52] U.S. Cl. ...................... 29/578; 29/580; 29/591; 96/36.2; 357/69

[51] Int. Cl.² ........................................ B01J 17/00

[58] Field of Search ............ 29/580, 578, 583, 589, 29/591; 96/36.2

[56] References Cited

UNITED STATES PATENTS

| | | | |
|---|---|---|---|
| 3,539,705 | 11/1970 | Nathanson | 29/580 |
| 3,620,932 | 11/1971 | Chrishal | 29/580 |
| 3,693,251 | 9/1972 | Jaccodine | 29/625 |

*Primary Examiner*—W. Tupman

*Attorney, Agent, or Firm*—Flehr, Hohbach, Lest, Albritton & Herbert

[57] ABSTRACT

A semiconductor assembly with beam lead construction having a semiconductor body with a planar surface and having devices formed in the body with contact areas on the surface. Beam leads make contact with the contact areas and have their outer ends cantilevered and spaced a substantial distance above the planar surface of the semiconductor body.

In the method for fabricating a semiconductor body with the beam lead construction, a very thick layer of photoresist is formed over the semiconductor body, beam leads are formed on the photoresist and thereafter the photoresist is removed so that the beam leads are positioned a substantial distance above the semiconductor body.

8 Claims, 14 Drawing Figures

INVENTOR.
Warren C. Rosvold
BY Flehr, Hohbach, Test, Albritton & Herbert
Attorneys INVENTOR.
Warren C. Rosvold
BY Flehr, Hohbach, Test, Albritton & Herbert
Attorneys INVENTOR.
Warren C. Rosvold
BY Flehr, Hohbach, Test, Albritton & Herbert
Attorneys INVENTOR.
Warren C. Rosvold
BY Flehr, Hohbach, Test, Albritton & Herbert
Attorneys INVENTOR.
Warren C. Rosvold
BY Flehr, Hohbach, Test, Albritton & Herbert
Attorneys

SEMICONDUCTOR ASSEMBLY WITH BEAM LEAD CONSTRUCTION AND METHOD

This is a continuation, of application Ser. No. 138,497 filed Apr. 29, 1971, now abandoned.

BACKGROUND OF THE INVENTION

1. Field of the Invention

This invention relates to a semiconductor assembly with a beam lead construction and method in which the major portions of the beam lead are spaced a substantial distance above the semiconductor body.

2. Description of the Prior Art

In the present day manufacture of semiconductor assemblies with beam leads, it has been necessary to extend the scribing grid to at least 7 mils to accommodate the cantilevered portions of the beam leads. In other circuitry utilizing other types of leads, it has been typical to utilize a 2 mil wide scribing grid. Thus, it can be seen that when it is desired to utilize beam leads in conjuction with integrated circuits which previously have used other types of leads, it is necessary to again lay out the existing circuitry to make it sufficiently large so that it will accommodate the beam leads. In addition to the additional labor required, this has meant that fewer devices can be formed on a single wafer. The loss of space for a 50 mil die will be 500 sq. mils for each die. Although very often 30 × 30 devices can be accommodated on a wafer, it can be seen that one out of five will be lost because of the increased space requirements for beam leads. In addition to this problem with beam leads, it has been found that many shorts develop. This is because at the point where the beams extend beyond the die, they are only separated from the substrate by a very thin dielectric layer which can be easily broken. Thus, during the time that the beam lead device is being checked or packaged, it is very often possible for these very thin dielectric layers to be broken and to permit shorts to form between the beam leads and the semiconductor body. There is also a difficulty in separating the individual dice from the wafer inexpensively and rapidly. There is, therefore, a need for a new and improved semiconductor assembly utilizing a beam lead construction and a method for making the same.

SUMMARY OF THE INVENTION AND OBJECTS

The semiconductor assembly consists of a semiconductor body which has a planar surface. At least one semiconductor device is formed in the semiconductor body by at least one junction which extends to the surface and defines a region in said body. The region is provided with a contact area on said planar surface. A layer of insulating material is disposed on said planar surface. The layer of insulating material has an opening therein in registration with the contact area. Contact means is formed in the opening. A beam lead is carried by the body and is in contact with said contact means. The beam lead extends above the insulating layer so that the outer end of the lead is cantilevered and is free of the body. The beam lead is spaced a substantial distance above the layer of insulating material.

In the method for fabricating a semiconductor assembly having a beam lead, a thick layer of photoresist is formed over the layer of insulating material. The beam lead is formed over the thick layer of photoresist and thereafter the thick layer of photoresist is removed so that the beam lead is disposed a substantial distance above the layer of insulating material.

In general, it is an object of the present invention to provide a semiconductor assembly with a beam lead construction which is compatible for use with integrated circuits which do not utilize beam leads.

Another object of the invention is to provide an assembly and method of the above character in which the beam lead construction does not require any more space than other types of construction that do not utilize beam leads.

Another object of the invention is to provide an assembly and method of the above character in which beam leads can be retrofitted onto existing circuitry without the necessity of again laying out the existing circuitry.

Another object of the invention is to provide an assembly and method of the above character which makes it possible to provide beam leads which do not short out to the substrate.

Another object of the invention is to provide an assembly and method of the above character in which high stress gradients are minimized or eliminated.

Another object of the invention is to provide an assembly and method of the above character in which it is possible to readily separate the dice or chips from the wafer.

Another object of the invention is to provide an assembly and method of the above character in which it is possible to scribe and crack the wafer into separate chips or dice.

Another object of the invention is to provide an assembly and method of the above character which is relatively inexpensive and economical.

Additional objects and features of the invention will appear from the following description in which the preferred embodiments are set forth in detail in conjunction with the accompanying drawing.

DESCRIPTION OF THE PREFERRED EMBODIMENTS

The semiconductor assembly incorporating the present invention is fabricated by first taking a semiconductor body 11 formed of a suitable semiconductor material such as silicon. The semiconductor body 11 can be a body without impurities. When such is the case, impurities of the desired type are diffused in the semiconductor body or, alternatively, the semiconductor body 11 can be purchased with the desired impurity concentration. Thus, for example, the body 11 has been shown with a P-type impurity therein.

Figure 1:
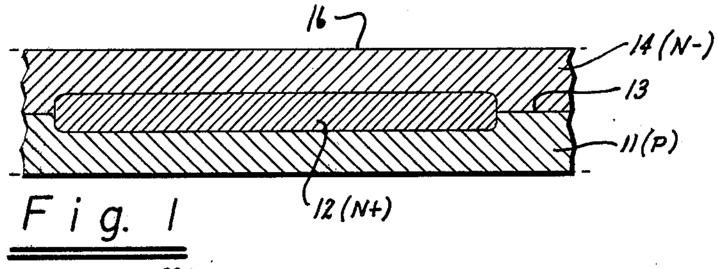
FIGS. 1–8 are cross-sectional views showing various steps in constructing a semiconductor assembly with a beam lead construction incorporating the present invention.

A buried layer 12 is formed in the semiconductor body in a manner well known to those skilled in the art. By way of example, a layer of insulating material (not shown) can be formed on the planar surface 13 and thereafter an opening formed in the insulating layer through which an N-type impurity is diffused to form the buried layer extending downwardly into the semiconductor body 11. Thereafter, the insulating layer can be stripped from the surface 13 and another layer 14 of semiconductor material is grown on the surface 13 of the semiconductor body 11. This layer 14 can be grown in any conventional manner such as in an epitaxial reactor to provide an epitaxial layer 14 with the desired impurity as, for example, an N-type impurity as shown in FIG. 1. During the time that this epitaxial layer is being grown, the N-type impurity which has been diffused into the semiconductor body 11 to provide the buried layer 12 will also diffuse upwardly into the epitaxial layer 14 as shown in FIG. 1. The epitaxial layer 14 is provided with a planar surface 16 through which the semiconductor devices will be formed as hereinafter described.

Figure 2:
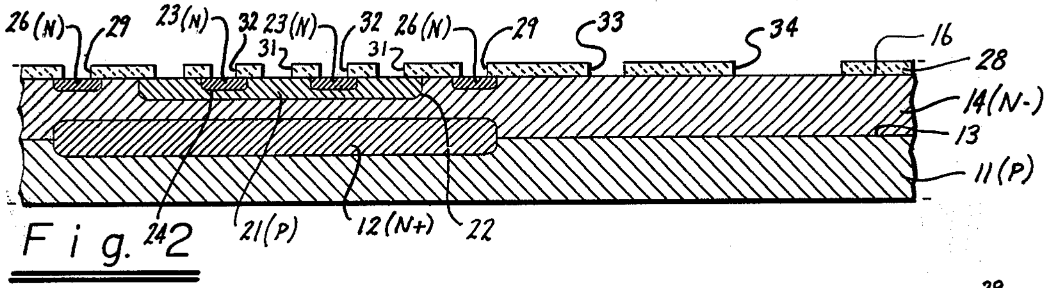

Conventional bipolar or MOS devices can then be formed in the epitaxial layer 14 in a manner well known to those skilled in the art. By way of example, a typical bipolar device in the form of a transistor can be formed in the manner shown in FIG. 2. Thus, typically, a layer of insulating material (not shown) such as silicon dioxide is grown on the surface 16. Thereafter, openings are formed therein through which a P-type impurity is diffused to form diffused regions 21 within the epitaxial layer 14 which are defined by dish-shaped PN junctions 22 which extend to the surface 16. The insulating layer can then be stripped and a new silicon dioxide layer (not shown) grown and additional openings formed therein. N-type impurities are diffused therethrough to form emitter regions 23 defined by dishshaped PN junctions 24 within the junction 22 and extending to the surface 16. In addition, at the same time there is provided additional N-type contact regions 26 which make contact to the collector region of the semiconductor device. The insulating layer can thereafter be stripped and a new insulating layer 28 formed on the surface 16 in a suitable manner such as by thermally growing the same or depositing the same on the surface 16. Thereafter, a plurality of openings are formed in the insulating layer 28. Thus, by way of example, as shown in FIG. 2, there are provided collector contact openings 29, base contact openings 31, emitter contact openings 32, beam lead openings 33 and scribe-line openings 34.

Rather than utilizing an aluminum system which provides an ohmic contact and interconnection capability in situ, a metallic silicide is utilized to obtain the transition from silicon to the interconnection metal. Thus, an appropriate metal such as platinum, nickel or molybdenum is evaporated or sputtered into the openings in the insulating layer 28. The semiconductor body is then heated to an appropriate temperature to form an alloy between the silicon and the metal which has been deposited in the openings. A suitable etch is then utilized to remove the remaining metal on the surface of the insulating layer 28 and in the openings in the layer 28 so that all that remains are the metal silicide contact regions 36 in the epitaxial layer 14 which are in registration with the openings in the insulating layer 28. For the metal silicide, it may be preferable to use nickel when it is desired to provide a lower barrier height for forming Schottky barrier diodes. In addition, it has been found that nickel is equivalent to platinum for making an ohmic contact.

Figure 3:
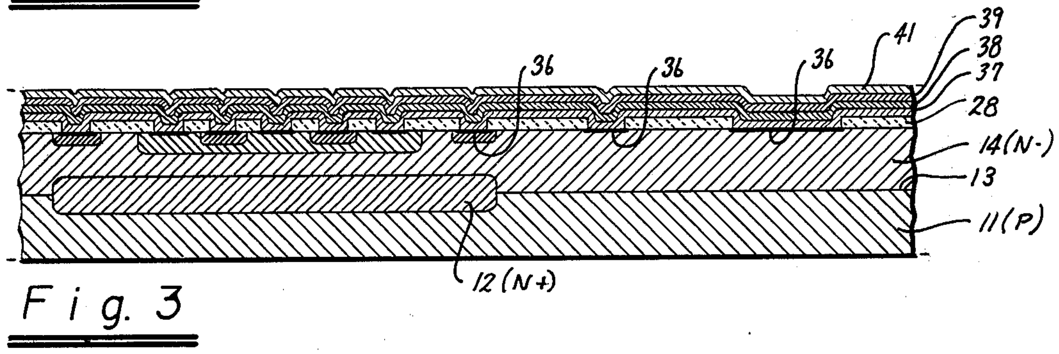
Figure 4:
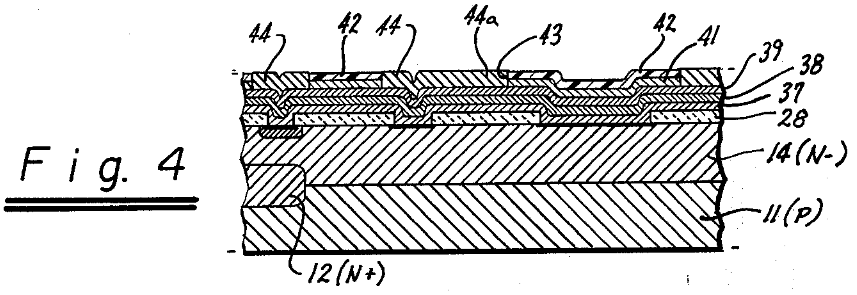

After the metal silicide contacts 36 have been formed, a layer 37 of a suitable metal such as titanium is evaporated over the surface of the insulating layer 28 and into the openings in the insulating layer 28 and thereafter, an additional layer 38 of a suitable material such as platinum is formed on the layer 37 as shown in FIG. 3. The layers 37 and 38 can be deposited either in a sputtering apparatus or by the use of an electron beam evaporator. A thin layer 39 of gold is then deposited on the surface of the platinum layer 38 to a suitable thickness as, for example, 3000 Angstroms. Thereafter, a very thin layer 41 of chromium is deposited on the gold layer 39 to a suitable thickness as, for example, a few hundred Angstroms. A layer 42 of photoresist is then deposited on the layer of chromium 41. The chromium layer 41 is utilized because it has been found that the photoresist layer 42 adheres better to chromium than it does to gold. The photoresist is then exposed in a conventional manner to ultra-violet light and the undeveloped photoresist is removed so that there are provided openings 43 wherever it is desired to provide a gold interconnect pattern. It should be noted that an opening is not provided in the photoresist over the scribe opening 34. A suitable etch is utilized to remove the chromium which is exposed in the openings 43. Thereafter, gold is plated up through the openings 43 by placing the semiconductor assembly shown in FIG. 4 in a conventional plating solution and plating up interconnects 44 to a suitable thickness as, for example, 3 microns to form relatively thick interconnects 44. The photoresist serves as a dielectric and, therefore, the gold will not plate up on the photoresist during the plating operation. At least certain of the interconnects 44 have contact pad portions 44*a* to which beam leads are bonded as hereinafter described. The contact pad portions 44*a* with the remaining portion of the interconnect extend into the opening 43 to form contact pad means.

After the plating operation has been completed, the remaining photoresist 42 is removed with an etch in a conventional manner. Thereafter, all of the thin unplated substrate metal layer is removed from the field in a suitable manner such as by sputter etching. The relatively thick interconnects 44 are not significantly affected by the sputter etching. Although some of the gold forming the interconnects 44 may be removed by the sputter etching, the substantial bulk of the same remains so that they form effective conductors as shown in FIG. 5.

After the "substrate metal" is removed in the field, scribe lines 46 are formed in the scribe-line openings 34 which form a part of a grid. The scribing operation can be performed with a conventional scribing machine of the type well known to those skilled in the art.

It should be appreciated this is the last opportunity in which the scribe lines can be placed in the grid of which the opening 34 forms a part. However, it should be also appreciated that, if desired, the scribe lines 46 can be placed in the epitaxial layer 14 during earlier steps in the process. For example, the scribe lines can be inserted any time after the grid of which the openings 34 form a part have been formed.

Figure 5:
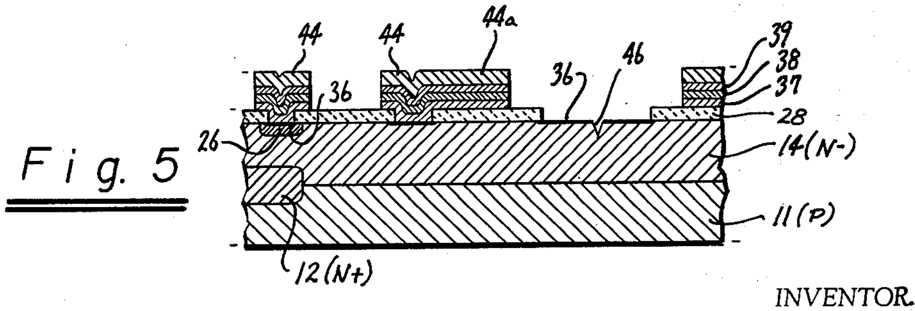
Figure 6:
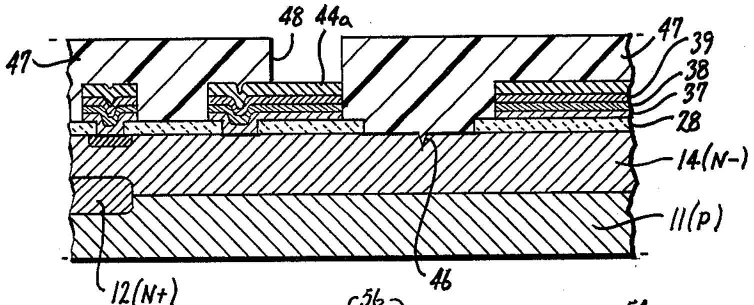

After the scribing operation has been completed, a very thick layer of photoresist is placed over the top of the structure as shown in FIG. 5 so that the openings therein are filled and so that a thick layer of photoresist extends over the entire surface of the gold interconnects 44. In order to perform its function properly, it is very desirable that this photoresist have a thickness at least as great as ½ of a mil to 1 mil. One photoresist found to be particularly satisfactory is "Phodar" supplied by Photopolymer Research of Milwaukee, Wisconsin. The "Phodar" resist is in solid form and has a laminated construction consisting of three layers. There is an intermediate photolithographic film which is covered on the top side by a clear plastic film and with a backing on the bottom side. The backing material is peeled off and then the "Phodar" is mounted on the top exposed surface of the wafer which has been processed to the point shown in FIG. 5. A suitable device for facilitating this mounting of the "Phodar" is hereinafter described. The clear plastic layer can be left on or, if desired, it can be peeled or stripped off so that there remains the photoresist layer which has a very sticky exposed surface. The clear plastic layer is provided so that the "Phodar" can be exposed through a mask without encountering the difficulty of the mask sticking to the photoresist layer. When the clear plastic layer is removed, it has been found that it is possible to neutralize a very thin layer on the upper surface of the photoresist so that it will not be sticky. This has been accomplished by subjecting the wafer after the photoresist has been applied to it and the clear plastic layer stripped therefrom by subjecting it to a vacuum bake for approximately 10 minutes at 100°C. The vacuum need not be a very good one as, for example, one represented by 20 inches of mercury. It has been found that this heat treatment causes an upper layer of the photoresist to harden so that it is no longer sticky. This has necessarily eliminated the necessity for the clear plastic layer and, therefore, eliminates the necessity for projecting through a clear plastic layer to expose the photoresist. The photoresist layer which remains has a thickness of at least ½ to one mil. The "Phodar" photoresist has the property that it is relatively immune chemically to other photoresists which can be utilized in conjunction with the "Phodar" if desired.

After the "Phodar" photoresist has been mounted on the wafer, it is exposed to ultra-violet light through a mask in a conventional manner. The photoresist is developed and the unexposed portions are removed to provide openings 48 which can be termed via holes 48 which extend through the thick photoresist layer 47 down to the gold interconnects 44. It has been found that when the Phodar has been treated in the manner hereinbefore described that excellent resolution can be obtained and that the openings or holes 48 are almost anisotropic, i.e., with vertical or straight side walls. Improved resolution is obtained when the clear plastic layer is removed. The plastic layer causes some internal reflections which makes it difficult to obtain good resolution. As explained above, other photoresists can be utilized with the Phodar as it is relatively inert and the chemicals of the other photoresists will not destroy the resolution which can be obtained with Phodar or the dimensions of the holes 48 which have already been formed therein.

Figure 7:
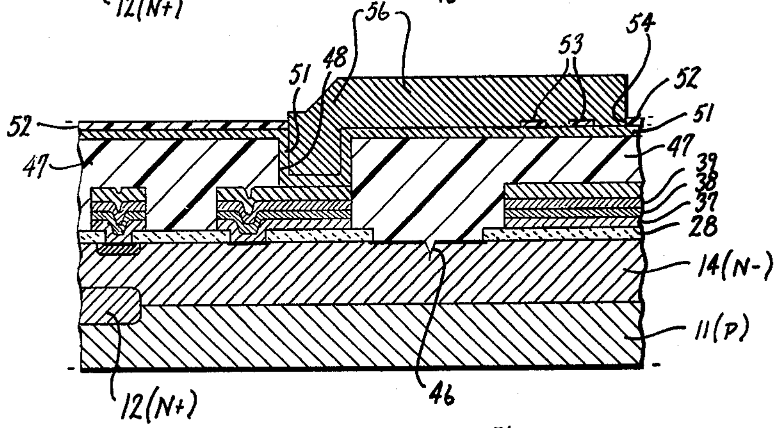

Because the Phodar photoresist 47 is a dielectric, it is not possible to plate a metal such as gold directly upon it. For this reason, a thin layer 51 of a suitable material such as gold is evaporated on the thick photoresist layer 47 and into the holes 48 and into contact with the gold interconnect 44 as shown in FIG. 7. The gold can have a suitable thickness, such as approximately 500 Angstroms.

In order to ensure maximum adhesion of the gold to the photoresist, it may be desirable to sputter etch the surface of the photoresist layer 47 to provide a very clean surface for the gold. It is also important that there be good adhesion of the gold layer 51 to the gold interconnects 44 to ensure that there is good mechanical support for the beam leads hereinafter provided as well as a good electrical contact.

A photoresist layer 52 is then deposited upon the gold layer 51. The photoresist can be of any suitable type such as Eastman Kodak type AZ1350H. The photoresist is exposed through a mask to provide the desired beam lead pattern. At the same time that the beam lead pattern is exposed, small indicia 53 are also provided in the photoresist at a position which is approximately 2 mils from the periphery of the die. As hereinafter explained, the indicia can be utilized to identify the die as, for example, this indicia can be used to identify the type of device carried by the die. The photoresist is then developed and the undesired portion is removed so that there remains elongate openings 54, one end of each of which is in registration with the openings or via holes 48. Beam leads 56 are then plated up through the openings 54 in the manner shown in FIG. 7 until they have a thickness of approximately ½ to 1 mil. This plating operation is carried out in the manner in which the previous plating operations are carried out. As can be seen from FIG. 9, the beam leads are formed over the integrated circuit or device which is formed in the adjacent die.

Figure 8:
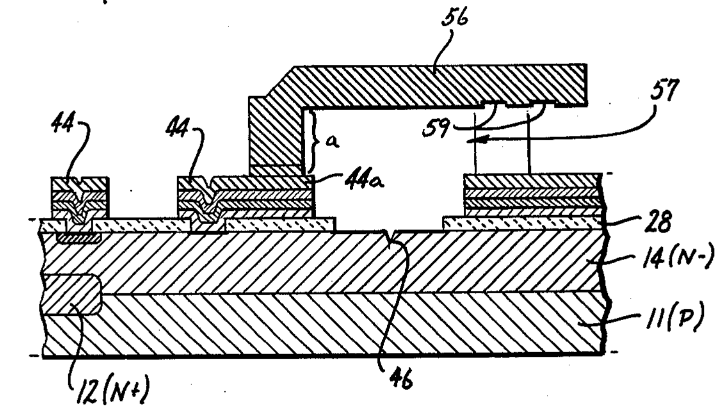

After the beam leads 56 have been electroformed, the photoresist layer 52 can be removed by a suitable etchant and thereafter, the thin gold layer 51 is removed with a suitable etch. Then a suitable etch such as sulphuric acid is utilized for removing the thick photoresist layer 47. The sulphuric acid removes the thick layer of photoresist in a relatively short time as, for example, within approximately 2 minutes at 140°C. As soon as the thick photoresist layer 47 has been removed, there is provided a space 57 below the lower surface of the beam leads 56 and the upper surface of the gold interconnects 44, which distance is indicated by the dimension *a* in FIG. 8. This distance *a* is equal to the thickness of the Phodar photoresist layer 47 which was removed and thus will be in excess of ½ mil.

The wafer may next be probed to determine which of the devices carried by the wafer are satisfactory and to mark the unsatisfactory dice to thereby perform an electrical sort.

Figure 9:
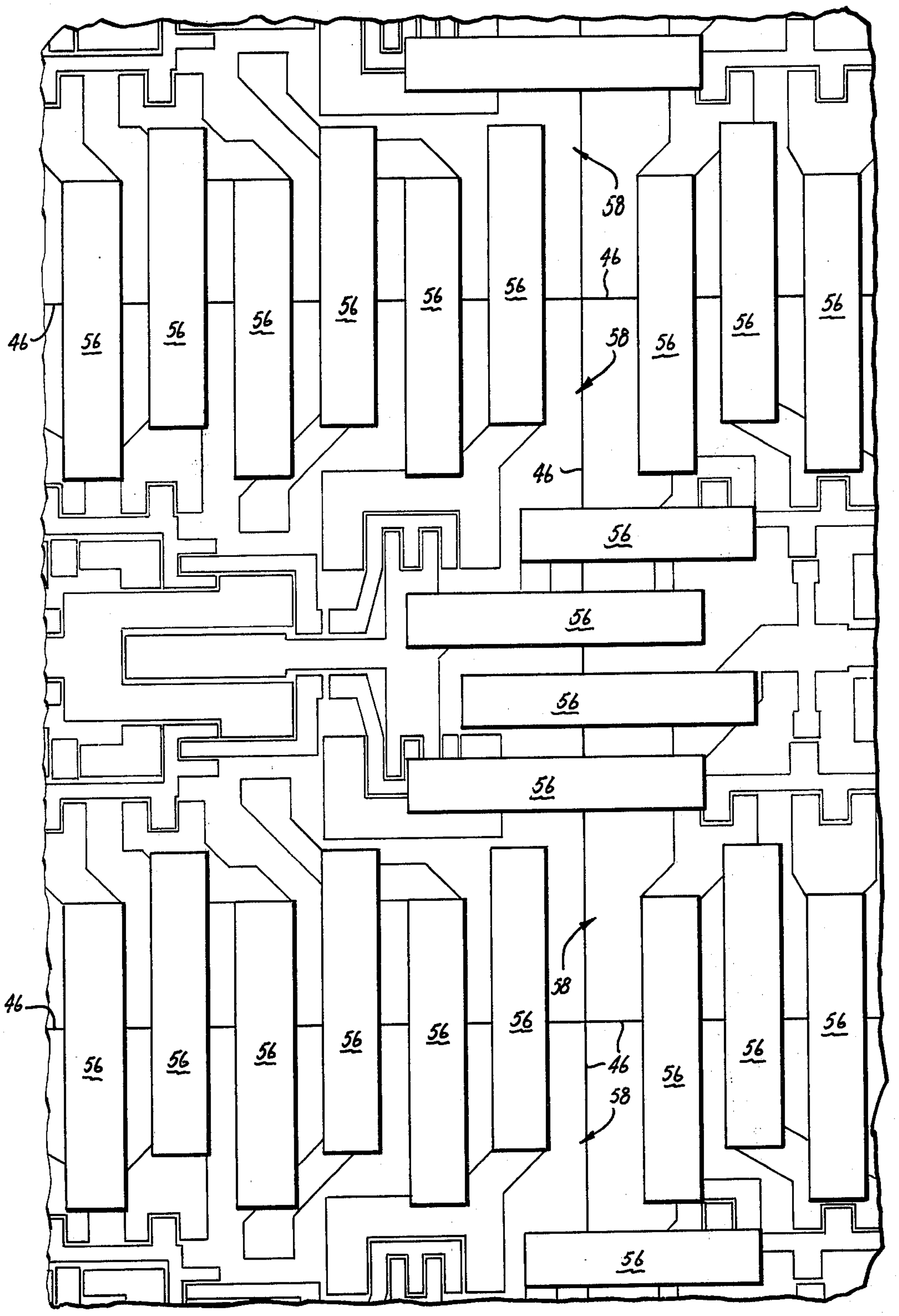
FIG. 9 is a plan view of the construction which is shown in FIG. 8.

From FIG. 9 it can be seen that the devices in the semiconductor body or wafer 11 are arranged so that the semiconductor body can be separated into a plurality of dice or chips 58 with each die having predetermined devices therein and with the dice arranged in a pattern with each die having other dice abutting the same. The beam leads for one die extend over the top of the adjacent dice. Thus, in the case of a four-sided die, the beam leads which extend over each of the four sides of the die extend over the four surrounding dice. In other words, the beam leads extend over the boundaries between the individual dice and extend over the adjacent chips or dice. It also can be seen that the beam leads of adjacent or abutting dice are interdigitated.

Figure 10:
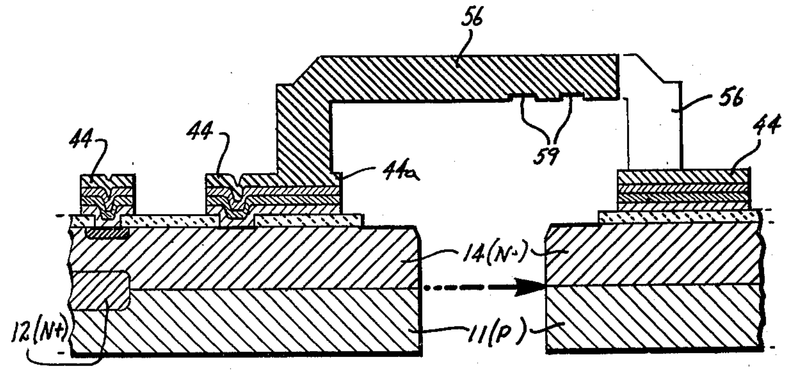
FIG. 10 is a cross-sectional view showing the manner in which the individual dice are broken apart.
Figures 11, 12:
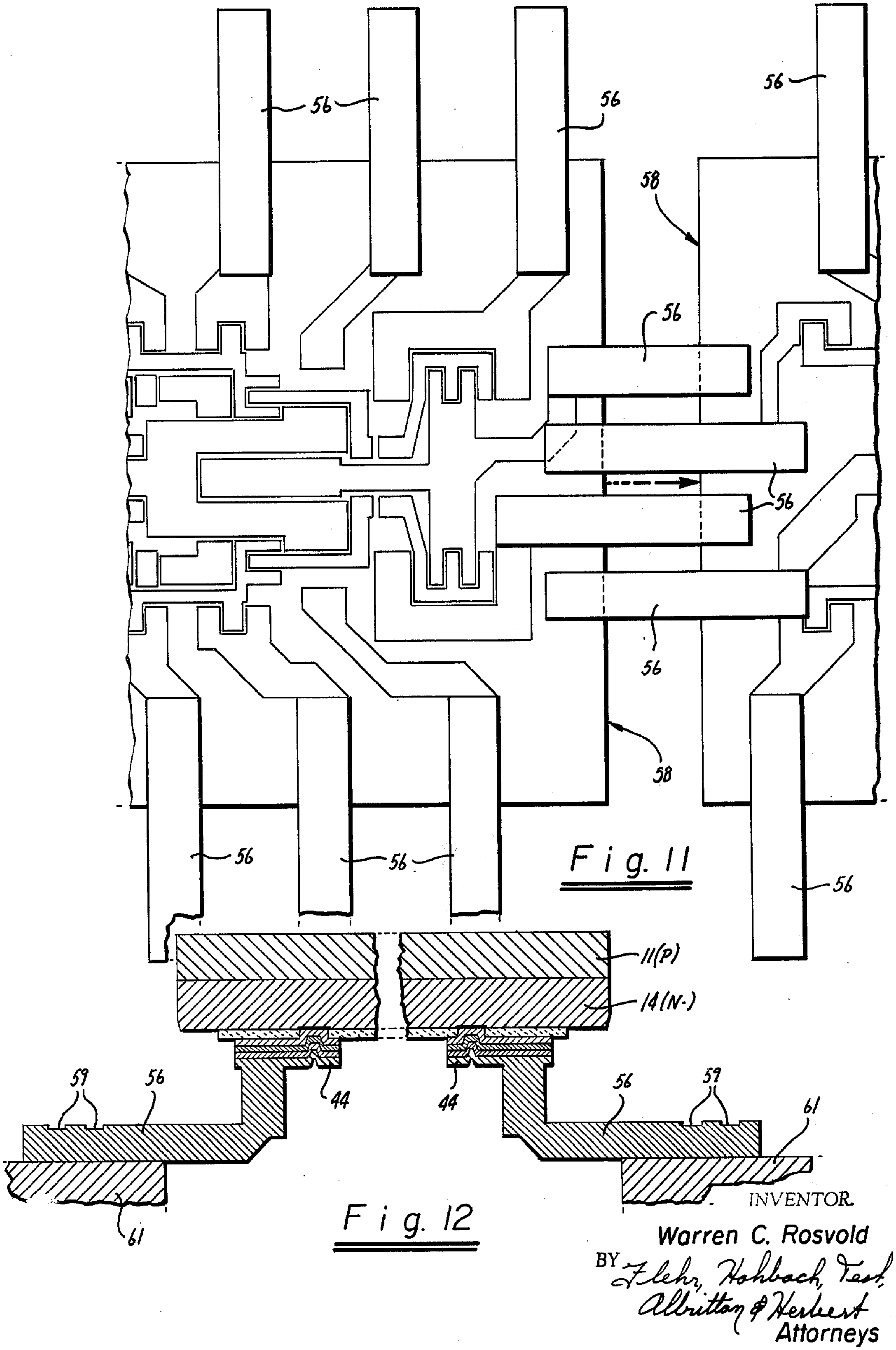
FIG. 11 is a plan view of a single chip or dice incorporating the present invention.
FIG. 12 is a cross-sectional view showing the manner in which a die or chip is mounted on a substrate.

After the electrical sort has been completed, the wafer can be broken into the separate dice or chips 58 by the use of a conventional wafer breaker to cause the wafer to be broken along the scribe lines 46 so that the wafer is broken in individual and separate dice. As soon as this has been accomplished, the indicia 59 on the bottom side of the beam leads 56 will be visible. A plan view of a single die or chip 58 is shown in FIG. 11. The beam lead 56 which is shown in FIG. 10 is connected to the emitter regions of the transistor. Other beam leads are connected to the base and collector regions of the transistor. In addition, other beam leads are connected to other components of the integrated circuit device which is shown in FIG. 11. The innermost ends of the beam leads are firmly secured to the gold interconnects 44 and are supported thereby. The beam leads extend upwardly from the interconnects so that the lower extremities of the beam lead are spaced a substantial distance above the gold interconnects as, for example, at least ½ a mil. The gold beam leads then extend beyond the body of the die or chip so that the outer ends of the beam leads are free and are cantilevered from the gold interconnect.

Since the present method permits portions of the beam leads to be fabricated over but not attached to the adjacent or abutting dice, this permits the dice to be electrically sorted before they are separated and also permits easy separation of the dice.

By performing the scribing operation before the beam leads are formed, it is possible to achieve the same ease of separation of the dice as with devices which do not utilize beam leads. In addition, by having the beam leads overlap the adjacent die, it is unnecessary to provide an additional space for the beam leads which makes it possible to utilize beam leads with devices of a conventional type in which it has not been contemplated to use beam leads with the same. Thus, it is possible to utilize beam leads with such circuitry without again laying out the circuitry to provide an additional space which is normally required for beam leads.

In certain respects, it should be possible to make the device smaller because the beam leads have eliminated the need for large bonding pads. For example, pads are conventionally 4×4 mils. whereas the beam lead is attached to the interconnect pattern in a 2×3 mil area. This represents a saving of 10 sq. mils per pad and with a typical 14 lead logic chip, it would mean a saving of 140 sq. mils on the chip.

The foregoing method has eliminated the need for chemical separation; rather by utilization of the scribe lines, the dice can be mechanically separated as hereinbefore described.

After the chips or dice have been sorted, the good chips or dice can be mounted upon a lead frame 61 of a conventional type as, for example, the lead frame which is utilized for making a dual in-line package by turning the die or chip upside down and bonding the beam leads 59 to the lead frame 61 by suitable means such as thermocompression bonding. It will be noted that when the die or chip is turned upside down, the indicia 59 are readily visible and can remain visible after the chip has been mounted upon the lead frame. Thereafter, the chip on the lead frame can be encapsulated in a suitable material such as plastic to provide a dual in-line package. Alternatively, if desired, the chip or die can be bonded to the lead frame face up with the under side of the beam leads 57 being thermocompression bonded to the leads 61. In view of the fact that the leads of the lead frame 61 are gold plated Kovar, the beam leads will make excellent connections with the lead frame 61. Thereafter, the die and the lead frame can be encapsulated in a suitable manner as, for example, in a ceramic package or in a plastic package. At this time it can be electrically checked to be sure that it meets all specifications. Thereafter, the packaged integrated circuit is ready for use.

By way of example, the circuit shown in FIG. 11 was a four input dual NOR gate (DTL) with the beam leads exiting from the die with a 0.5 mil air gap. The beam leads had a thickness of 0.75 mils and extended beyond the die for a distance of 10 mils. The beam leads on each side were spaced apart from each other by 8 mils. All the beam leads were mathematically related to the center of the die.

Figure 13:
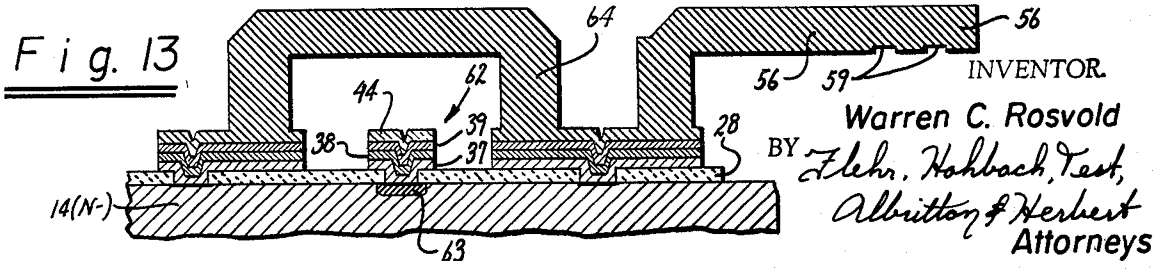
FIG. 13 is a cross-sectional view of another embodiment of the invention showing its use in spanning leads to provide a two-level interconnect.

Another embodiment of the invention is shown in FIG. 13 and shows the manner in which the invention would be utilized for "lead spanning" techniques to thereby make possible a two-level interconnect system for the integrated circuit. Thus, as shown in FIG. 13, there can be provided a first level interconnect system, a portion of which is represented by the lead 62 as shown in FIG. 13. This can be accomplished by taking the structure which is shown in FIG. 3 and forming the interconnect 44 which forms a part of the lead 62 at the same time that the other interconnects 44 and the contact pad portions 44*a* are formed in FIG. 4. Thereafter, an etching operation of the type hereinbefore described can be utilized to separate the lead 62 from the remaining structure so that there is provided a lead which consists of the gold interconnect 44 and the underlying layers 37, 38 and 39.

It should be appreciated that, if desired, a simpler interconnect system can be utilized. For example, in place of the lead structure 62 shown in FIG. 13, a simple lead structure can be provided by evaporating aluminum or gold onto the insulating layer 28 and then removing the undesired portions of the aluminum or gold by conventional photolithographic techniques. The first layer of metallization which includes the cross-under lead 62 can be connected to the desired portions of the integrated circuit. For example, as shown in FIG. 13, contact can be made to the surface of a diffused region 63 in the manner hereinbefore described for the formation of the beam leads. The second level jumper or interconnect 64 can be formed at the same time that the beam leads 56 are being formed. Thus, a thick layer of photoresist may be deposited over the first level of metallization including the cross-under lead 62. Thereafter, the thin gold layer 51 can be deposited as well as the photoresist layer 52. The photoresist layer 52 is exposed so that when the photoresist is developed, there is provided an elongate region in which the second level metallization which includes the crossover 64 can be electroformed. The photoresist layer 52 and the thin gold layer 51 can be removed in the manner hereinbefore described. Similarly, the thick photoresist layer 47 can be removed in the manner hereinbefore described so that there is provided a space between the cross-over 64 and the lead 62 so that it spans the lead 62 with the lower surface of the crossover lead 64 being spaced at least approximately one-half of a mil above the surface of the insulating layer 28. Thus, it can be seen that the present invention makes possible the formation of two-level metallization for interconnecting the integrated circuit without the addition of any additional steps. In other words, a lead spanning technique is provided as a part of the method.

Figure 14:
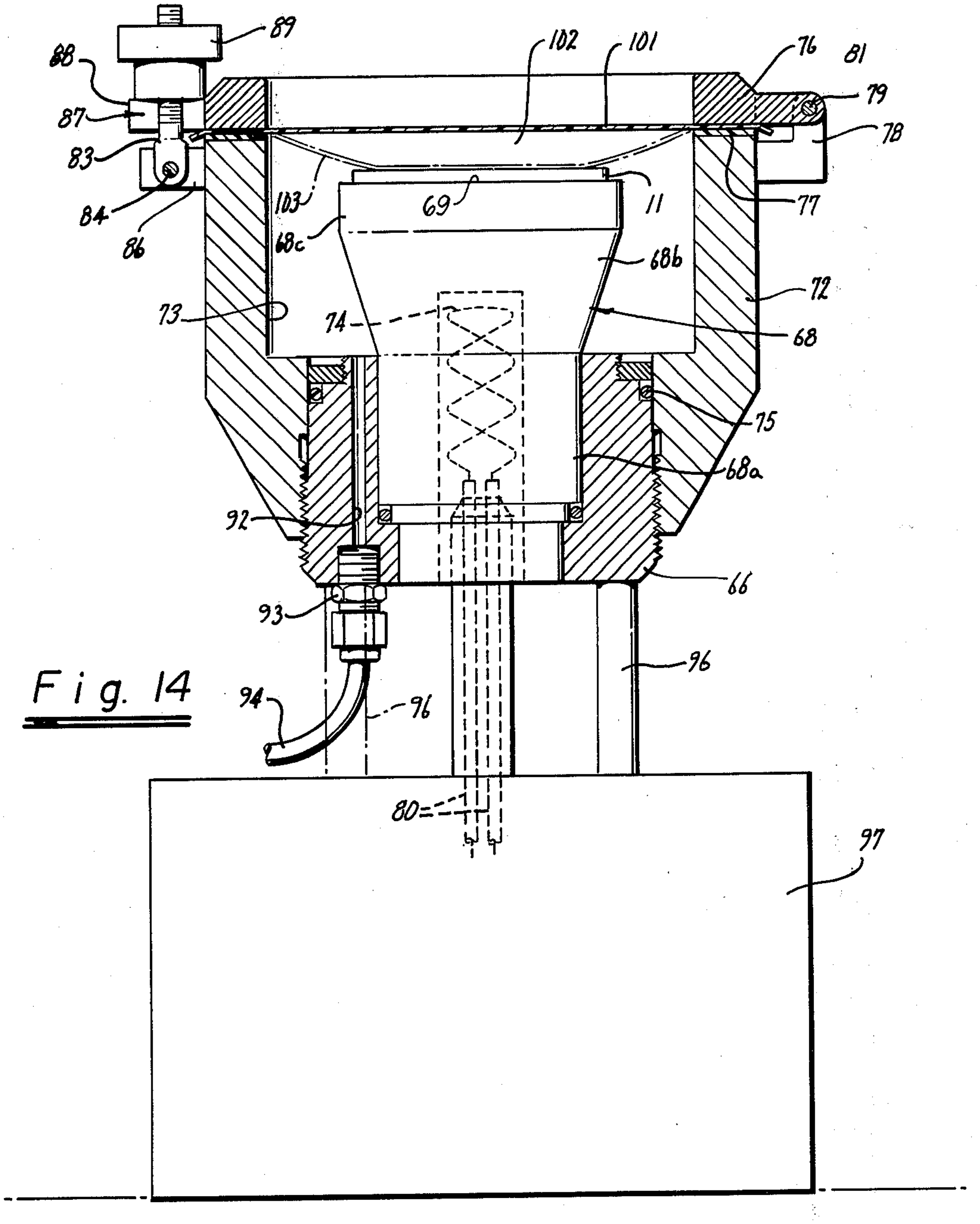
FIG. 14 is a cross-sectional view showing a device which is utilized for applying dry photoresist to a wafer in practicing the present invention.

A device or applicator for applying dry photoresist such as the Phodar hereinbefore described is shown in FIG. 14. It consists of a hollow cylindrical support block 66 that is formed of a suitable material such as metal. A heater block 68 is mounted in the cylindrical support 66. It is provided with a cylindrical portion 68*a* which fits within the cylindrical support block 66. The heater block is also formed with an outwardly tapered portion 68b which extends above the support 66 and a cylindrical portion 68c which is provided with a planar horizontal surface 69. The surface 69 is of such a size so that it can readily accommodate a semiconductor wafer 11 of the type hereinbefore described.

A cylindrical support housing 72 is mounted on the exterior side of the upper end of the cylindrical support block 66 and is secured to the cylindrical support block 66 in such a manner that an air-tight seal is formed between the housing 72 and the support 66. Thus, as shown, the housing 72 is threadedly mounted on the support block 66. O-ring sealing means 75 is provided for forming a seal between the housing 72 and the block 66. The housing 72 is provided with a cylindrical recess 73 as shown in FIG. 14 which accommodates the upper end of the block 68. A heater 74 is mounted in the block 68 and is connected by conductors 80 to a suitable source of electrical energy. The heater is provided with means (not shown) for thermostatically controlling the temperature of the heater block 68 so that the heater block 68 is maintained at a predetermined temperature as, for example, 90° – 100°C.

A cylindrical application ring 76 is provided and has a size which is generally the same as that of the housing 72 and is adapted to be mounted upon the housing in such a manner that an air-tight connection is formed between the ring 76 and the housing 72. A gasket 77 is provided between the ring 76 and the housing 72 to facilitate the making of an air-tight connection between the ring 76 and the housing 72. Means is provided for securing the ring 76 to the housing 72, and consists of a bracket 78 mounted on the housing 72 to which the ring 76 is hinged by a pin 79 extending through an ear 81 provided on the ring 76. Such means also includes releasable latching means in the form of a threaded pin 83 that is pivotally connected by a pin 84 to an ear 86 mounted on the housing 72. The pin 83 can be swung into a slot 87 provided in an ear 83 formed on the ring 76. A knob 89 is threaded onto the pin 83 and is provided for locking the ring 76 in a closed position as shown in FIG. 14.

Means is provided for supplying a vacuum to the recess 73 and consists of a passage 92 formed in the support block 66. A fitting 93 is threaded into the block 66 and has connected thereto a tube 94 that is connected to a suitable source of vacuum (not shown).

The entire assembly hereinbefore described can be mounted in a suitable manner. Thus, as shown in FIG. 3, the block 66 can be supported on a pair of posts 96 mounted on a box 97 which can have mounted therein the controls for the heater 74.

In operation of the device, a sheet 101 of Phodar is placed over the housing 72 with the ring 76 in an open position so that the sheet overlies a space 102 above the wafer 11. The ring 76 is then brought to a closed position and secured in place by the knob 89 to clamp the outer annular margin of the sheet 101 between the ring 76 and the housing 72. In mounting the Phodar sheet 101 on the housing 72, the backing on the Phodar can be stripped away and then the Phodar sheet can be applied to the housing 72 with the back side facing downwardly. After the Phodar sheet 101 has been clamped in place, the outer extremities can be trimmed away so that the Phodar sheet 101 has the same general size as the ring 76.

After the Phodar sheet 101 is in place as shown in FIG. 14, the vacuum can be applied to the recess 73 to bring the back side of the Phodar sheet 101 down into contact with the upper side of the wafer 11 as shown by the broken line representation 103 of the Phodar sheet 101. Since the wafer 11 has previously been heated to the desired temperature by the heated block 63, the bottom side of the Phodar comes into intimate contact with the top surface of the wafer 11. The Phodar sheet 101 may then be cut from the ring 76 and can be trimmed down to the size of the wafer 11. Thereafter, the processing operations hereinbefore described can be carried out.

It is apparent from the foregoing that there has been provided a semiconductor assembly with a beam lead construction and a method for making the same which have many advantages. The type of construction and the method utilized do not require any additional area for the use of beam leads because space over the adjacent dice is utilized for fabricating the beam leads. In this way it is possible to utilize existing layouts of devices in which the beam leads had not been utilized. The present method makes it possible to utilize conventional wafer breaking techniques without the necessity of going through the necessary steps for chemical etching for separation. Since the beam leads are spaced above the insulating layer, the beam leads do not introduce high stress gradients into the insulating layer. Also, multi-level interconnects can be provided without any additional steps.

I claim:

1. In a method for fabricating a semiconductor assembly having beam leads, providing a semiconductor body having a planar surface, forming a plurality of semiconductor devices in said body with each of the semiconductor devices having at least one junction extending to said surface and defining a region in said body and having a contact area generally on said surface, forming a layer of insulating material on said surface, forming openings in said layer of insulating material, forming contact pad means on said layer of insulating material extending through said openings for making contact with said contact areas, delineating a plurality of dice in said semiconductor body with each die having certain semiconductor devices therein, depositing a thick layer of photoresist in an initially solid form over said contact pads to a thickness in excess of approximately ½ mil, forming openings in said thick layer of photoresist in registration with said contact pad means, forming beam leads overlying said photoresist and extending through said openings to make electrical contact with said contact pad means and being physically secured thereto, said beam leads extending over the boundaries of said dice and overlying adjacent dice and with the beam leads of each die being insulated from the beam leads of adjacent dice, and removing the thick layer of photoresist so that the beam leads are cantilevered and have their lower surfaces spaced above the layer of insulating material a distance in excess of approximately ½ mil and separating the body to form separate and individual dice with the beam leads mounted thereon.

2. A method as in claim 1 wherein said delineation is carried out by forming scribe lines in the surface before the thick layer of photoresist is put in place.

3. A method as in claim 1 together with the step of forming indicia on the beam leads on the underside of the same.

4. A method as in claim 1 together with evaporating a thin layer of gold on said photoresist and thereafter electroforming the beam leads.

5. A method as in claim 1 together with the step of forming a first lead means carried by said body and interconnecting said devices and forming additional lead means interconnecting said devices at the same time that the beam leads are formed to provide at least one portion which spans and is spaced above a portion of said first lead means.

6. In a method for fabricating a semiconductor assembly having beam leads, providing a semiconductor body having a planar surface, forming a plurality of semiconductor devices in said body with each of the semiconductor devices having at least one junction extending to said surface and defining a region in said body and having a contact area generally on said surface, forming a layer of insulating material on said surface, forming openings in said layer of insulating material, forming contact pad means on said layer of insulating material extending through said openings for making contact with said contact areas, delineating a plurality of dice in said semiconductor body with each die having certain semiconductor devices therein, depositing a dry thick layer of photoresist over said contact pads, said photoresist having a photolithographic layer and a clear plastic layer, said clear plastic layer being removed prior to placement of the photoresist over said contact pads, baking the photoresist at an elevated temperature to reduce the stickiness of the photoresist, forming openings in said thick layer of photoresist in registration with said contact means, forming beam leads overlying said photoresist and extending through said openings to make electrical contact with said contact pad means and being physically secured thereto, said beam leads extending over the boundaries of said dice and overlying adjacent dice and with the beam leads of each die being insulated from the beam leads of adjacent dice, and removing the thick layer of photoresist so that the beam leads are cantilevered and have their lower surfaces spaced above the layer of insulating material a distance in excess of approximately ½ mil and separating the body to form separate and individual dice with the beam leads mounted thereon.

7. A method as in claim 6 wherein said photoresist is applied to the semiconductor body by drawing said photoresist down onto the semiconductor body by use of a vacuum.

8. In a method for fabricating a semiconductor assembly having beam leads, providing a semiconductor body having a planar surface, forming a plurality of semiconductor devices in said body with each of the semiconductor devices having at least one junction extending to said surface and defining a region in said body and having a contact area generally on said surface, forming a layer of insulating material on said surface, forming openings in said layer of insulating material, forming contact pad means on said layer of insulating material extending through said openings for making contact with said contact areas, delineating a plurality of dice in said semiconductor body with each die having certain semiconductor devices therein, placing a sheet of photoresist having a thickness in excess of approximately 0.5 mil over the contact pads, drawing the sheet of photoresist down onto the semiconductor body by use of a vacuum to form a thick layer of photoresist on said body, forming openings in said thick layer of photoresist in registration with said contact pad means, forming beam leads overlying said photoresist and extending through said openings to make electrical contact with said contact pad means and being physically secured thereto, said beam leads extending over the boundaries of said dice and overlying adjacent dice and with the beam leads of each die being insulated from the beam leads of adjacent dice, removing the thick layer of photoresist so that the beam leads are cantilevered and have their lower surfaces spaced above the layer of insulating material a distance in excess of approximately ½ mil, and separating the body to form separate and individual dice with the beam leads mounted thereon.

* * * * *